United States Patent [19]
Patel

[11] Patent Number: 4,849,975
[45] Date of Patent: Jul. 18, 1989

[54] ERROR CORRECTION METHOD AND APPARATUS

[75] Inventor: Arvind M. Patel, San Jose, Calif.

[73] Assignee: International Business Machines Corporation, Armonk, N.Y.

[21] Appl. No.: 119,011

[22] Filed: Nov. 10, 1987

[51] Int. Cl.$^4$ ............................................. G06F 11/10
[52] U.S. Cl. ........................................ 371/38; 371/39
[58] Field of Search ....................... 371/37, 38, 39, 40

[56] References Cited

U.S. PATENT DOCUMENTS

| | | | |
|---|---|---|---|
| 4,464,753 | 8/1984 | Chen | 371/38 |
| 4,525,838 | 6/1985 | Patel | 371/37 |
| 4,541,092 | 9/1985 | Sako et al. | 371/39 |
| 4,637,021 | 1/1987 | Shenton | 371/37 |
| 4,703,485 | 10/1987 | Patel | 371/37 |
| 4,706,250 | 11/1987 | Patel | 371/39 |
| 4,769,818 | 9/1988 | Mortimer | 371/37 |

OTHER PUBLICATIONS

R. C. Bose and D. K. Ray-Chaudhuri, "On a Class of Error-Correcting Binary Group Codes", Inf. Control 3, pp. 68–79, 1960.
I. S. Reed and G. Solomon, "Polynomial Codes Over Certain Finite Fields", J. Soc. Indust, Appl. Math 8, pp. 300–304, 1960.
R. T. Chien, "Cyclic Decoding Procedures for Bose--Chaudhuri-Hocquenghem Codes", IEEE Trans, Inf. Theory, vol. IT10, pp. 357–363, 1964.

Primary Examiner—Charles E. Atkinson
Attorney, Agent, or Firm—Henry E. Otto, Jr.

[57] ABSTRACT

A method and apparatus is disclosed for correcting up to two byte errors in encoded uncorrected data in records of a predetermined length. As illustrated, the records are subblocks of a block in a multi-level error correction code format. The data is read from a storage device and corrected by decoding and processing four syndromes of error ($S_1$, $S_2$, $S_3$, $S_0$) that are generated by means disclosed in the prior art. These syndromes are decoded in response to uncorrected errors in any one record by computing vectors (P, Q, and R), which are functions of the four syndromes. Binary numbers (u and v) are then determined from these vectors by table look-up to enable calculation of one value (d) from the sum of said binary numbers for determining error locations. Another value (t), mathematically related to said one value, is then determined by table look-up and the error location values (y and z) are determined by calculating the offset of binary numbers (u,v) from the other value (t). Finally, error patterns ($E_y$ and $E_z$) are determined by table look-up.

10 Claims, 2 Drawing Sheets

ERROR CORRECTION METHOD AND APPARATUS

BACKGROUND OF THE INVENTION

1. Field of the Invention

This invention relates to a method and apparatus for correcting errors in encoded uncorrected data in a storage device, and more particularly to a method and apparatus using a unique implementation involving look-up tables for decoding syndromes of error indicative of at least two errors in said data.

2. Description of Background Art

The following references disclose basic theories and various methods and arrangements for correcting errors in storage devices: W. W. Peterson, *Error-Correcting Codes*, M.I.T. Press, 1961; R. C. Bose and D. K. Ray-Chaudhuri, "On a class of error-correcting binary group codes", Inf. Control 3, pp. 68–69, 1960; I. S. Reed and G. Solomon, "Polynominal codes over certain finite fields", J. Soc. Indust. Appl. Math 8, pp. 300–304, 1960; and R. T. Chien, "Cyclic decoding procedures for Bose-Chaudhuri-Hocquenghem codes", IEEE Trans. Inf. Theory, Vol. IT10, pp. 357–363, 1964.

In the copending application U.S. Ser. No. 781,449, filed Sept. 27, 1985 (now U.S. Pat. No. 4,706,250, issued Nov. 10, 1987), assigned to the assignee of the present invention, there is disclosed a two-level error correction code structure in an improved multibyte error-correcting subsystem. Data is formatted on a disk track into a number of subblocks, each within a respective block. There are also two sets of three subblock check bytes $C_1$, $C_2$ and $C_3$. One set is associated with the even phase and the other with the odd phase, thus providing interleaved codewords. With this arrangement, the first level of correction (of subblock errors) is done on-the-fly at the storage device after being delayed one subblock, and the data is sent to the storage director for correction of any second level (block) errors. This on-the-fly correction is suitable only for systems operating in an asynchronous environment. The second (block) level correction is carried out using one additional check byte $C_0$ for each phase at the end of the block.

The aforementioned copending application discloses hardware in a disk storage device that receives uncorrected data in real time and generates three first-level syndrome bytes and one second-level syndrome byte (corresponding to each phase). The first-level syndromes are decoded at the device into error pattern and error location information that is transmitted to a storage director.

This aforementioned application describes how the system functions if there are no errors in any subblock, and how errors are corrected if there is not more than one error per subblock and if there is more than one error per subblock. More specifically, syndromes $S_1$, $S_2$, $S_3$ corresponding to each phase associated with a particular subblock codeword are held in a local memory. They are retained for further processing at the block level if that particular subblock's syndromes were not all zeros and no nonzero error pattern was generated by a first level decoder. The local memory also retains the identification of an uncorrected subblock as subblock identifier "f". At the end of the block, a second level syndrome, $S_0$, from a second level syndrome generator and the first level syndromes $S_1$, $S_2$, $S_3$ for subblock f from the local memory are processed by a second level decoder to correct two errors in subblock f.

There is a need for a less expensive, yet efficient, method and apparatus which uses unique look-up tables implemented in firmware or software to decode the syndromes for two-byte errors in a record of a predetermined number of bytes, in which each byte contains a desired preselected number of bits; e.g., two-byte errors in any one subblock of a two-level code format similar to that described in said copending application.

SUMMARY OF THE INVENTION

Toward this end and according to the invention, a method and apparatus is provided for correcting up to two byte errors in encoded uncorrected data in records of a predetermined length (such as a preidentified subblock of a block in the case of a multi-level error correction code format). The data is read from a storage device and corrected by decoding and processing four syndromes of error ($S_1$, $S_2$, $S_3$, $S_0$) that are generated by means disclosed in the aforementioned copending application. These syndromes are decoded in response to uncorrected errors in any one record by computing vectors P, Q and R, which are functions of the four syndromes. Binary numbers u and v are then calculated from these vectors by table look-up to enable calculation of a value of d from the sum of said binary numbers toward determining error locations. A value t, having a specific mathematical relation to the value of d, is then determined by table look-up and the error location values y and z are calculated from the offset of binary numbers u and v from the value t. Finally, the error patterns $E_y$ and $E_z$ are determined by table look-up.

As illustrated, and more specifically, errors in encoded uncorrected data in a disk storage device are corrected using a multiple level error correction code formatted into a block containing a number of subblocks. During a read operation, first level syndromes of error ($S_1$, $S_2$, $S_3$) for each subblock and an additional second level syndrome ($S_0$) common to all subblocks of the block are generated by hardware in the storage device. The first level syndromes are decoded by table look-up to provide first level error pattern and location information. The second level syndromes are decoded by computing vectors that are functions of the first and second level syndromes. The second level error locations and error patterns are determined by software or firmware using look-up tables. Any correction of errors, if needed, is done later by sending error information in a deferred mode.

The foregoing and other objects, features and advantages of the invention will be apparent from the following more particular description of a preferred embodiment of the invention as illustrated in the accompanying drawings.

DESCRIPTION OF PREFERRED EMBODIMENT

Figure 1:
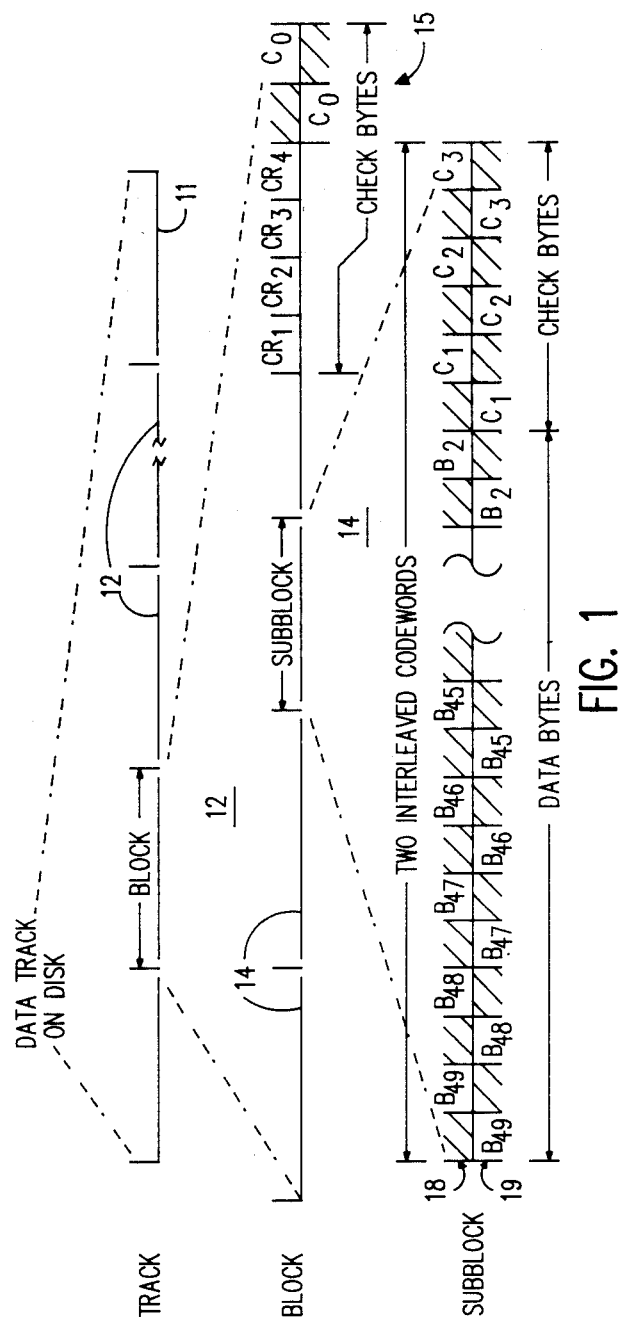
FIG. 1 illustrates a data format of a disk track that embodies a two-level code structure used in connection with the present invention.

FIG. 1 illustrates the data format of a disk track that embodies a two-level code structure implementing the present invention. As illustrated, data is recorded along a track 11, formatted into a plurality of fixed or variable length blocks 12. Each block 12 is divided into fixed length subblocks 14. As illustrated, each subblock 14 comprises two interleaved codewords 18, 19. Each codeward 18, 19 comprises 48 data byte positions and three subblock check bytes $C_1$, $C_2$, $C_3$. Each block 12 thus comprises subblocks, each having 96 (two pairs of 48) data byte positions and three pairs of subblock check bytes $C_1$, $C_2$, and $C_3$. In addition, four check bytes $CR_1$–$CR_4$ for data integrity checking after ECC correction and one pair of check bytes $C_0$ for second level error correction are appended to the end of each block 12 in a block check byte area 15. The manner in which the error correction check bytes $C_1$–$C_3$ in each subblock 12 and check bytes $CR_1$–$CR_4$ and $C_0$ at the end of each block 12 are determined and produced forms no part of the present invention. The reader is referred to the aforementioned copending application, for a detailed explanation. In the following description of this invention, all process steps will be described for one of the two phases (even or odd); however, it is to be understood that the same steps and process are repeated for the other phase.

Figure 2:
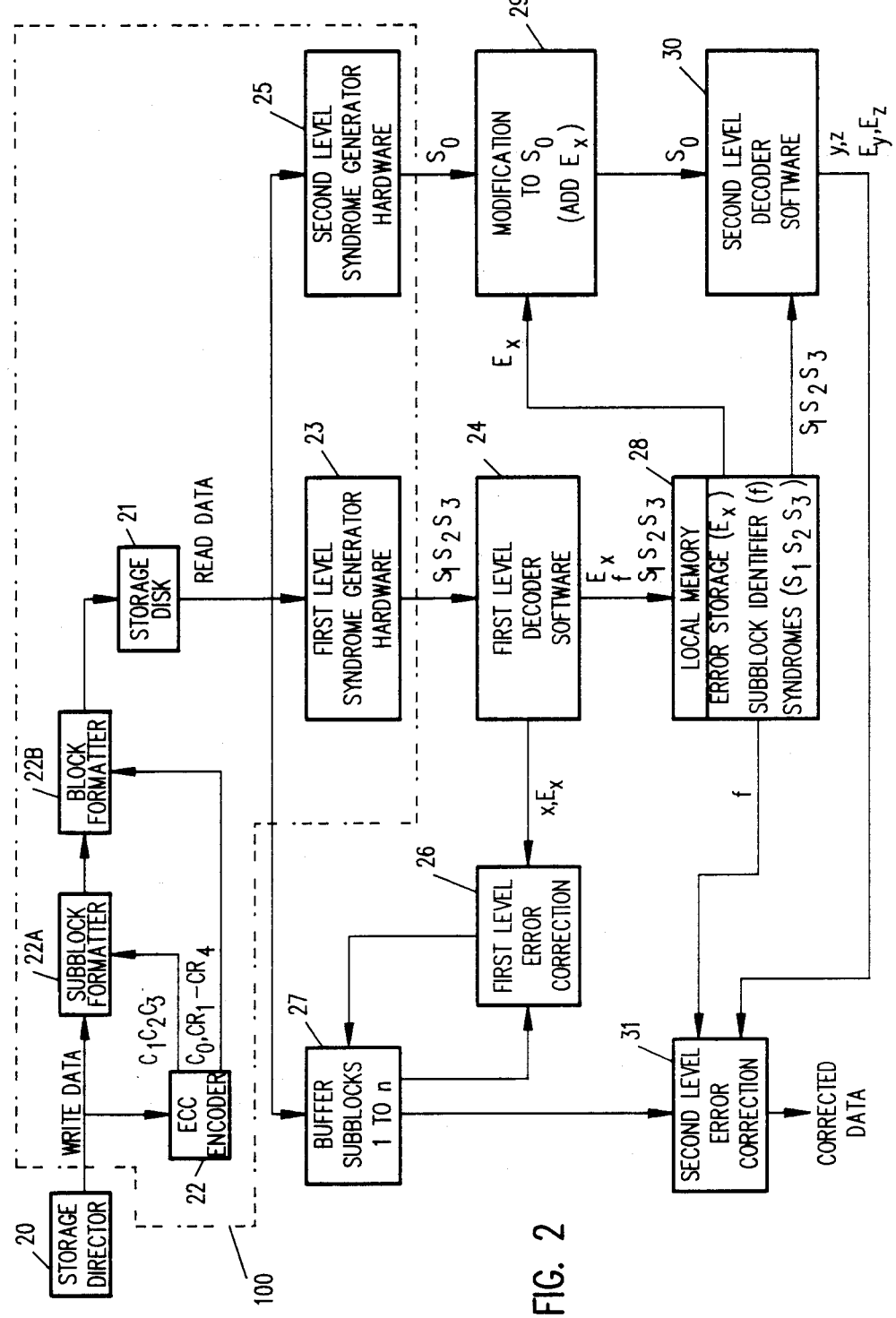
FIG. 2 is a block diagram of the first and second level correcting portions of an ECC apparatus according to one embodiment of the invention showing flow of the data and depicting the hardware resident in the storage device and software resident in the storage director.

Referring now to FIG. 2, data from a data processing system (not shown) is sent via a control unit or storage director 20 to storage disk 21 of a disk storage device 100 for writing on a track which is formatted as shown in FIG. 1. In the writing and transfer of this data, three sets of check bytes $C_1$, $C_2$ and $C_3$ are developed for each subblock by an ECC encoder 22. Block check byte $C_0$ (and data integrity check bytes $CR_1$–$CR_4$) are also developed by encoder 22. A subblock formatter 22A appends check bytes $C_1$, $C_2$ and $C_3$ to each corresponding subblock. A block formatter 22B appends block check byte $C_0$ (as well as data integrity check bytes, $CR_1$–$CR_4$) at the end of the block. The formatted data is then recorded on storage disk 21. Computation and processing of the data integrity check bytes $CR_1$–$CR_4$ forms no part of the present invention and is described in U.S. Pat. No. 4,703,485, issued Oct. 27, 1987, assigned to the assignee of the present invention.

In the readback process, the read data are checked by coding equations (1), (2), (4) and (5) in the aforementioned copending application in order to develop the syndromes of error in the conventional manner. Subblock check bytes $C_1$, $C_2$ and $C_3$ are associated with syndromes $S_1$, $S_2$ and $S_3$, while block-level check byte $C_0$ is associated with the $S_0$ syndrome byte.

The subscript numbers assigned to the syndromes, e.g., $S_0$, $S_1$, etc., are related to the particular T matrix employed to generate the respective check characters. Specifically, $S_0$, which is developed from $C_0$, corresponds to a conventional parity check byte. $S_3$, on the other hand, is developed from $C_3$ which is generated in accordance with logic that involves multiplying the input byte by a matrix $T^3$. Syndromes $S_1$ and $S_2$, which correspond to check bytes $C_1$ and $C_2$, respectively, are similarly generated, using logic which involves matrices $T^1$ and $T^2$, respectively. Such logic for syndrome generation is well known and forms no part of the present invention.

During the readback process, uncorrected data is read from disk 21 to a first level syndrome generator 23 and a second-level syndrome generator 25 which generate first-level syndrome bytes $S_1$, $S_2$, $S_3$ for each subblock and a second-level syndrome $S_0$ common to all subblocks of the block. The syndrome bytes $S_1$, $S_2$, $S_3$ are transmitted to a first level decoder 24 in storage director 20 for decoding into error pattern data. The software-implemented decoding process for decoder 24 is described below in a separate section entitled "First Level Decoding Process".

Briefly, a nonzero value for $S_1$, $S_2$ or $S_3$ indicates an error. If a subblock has only one byte in error, its location x and error pattern $E_x$, as determined by decoder 24, will be supplied to the software 26 for correction of the appropriate byte fetched from subblock buffer 27. After correction, this byte is restored into buffer 27. The error pattern $E_x$ will also be stored in local memory 28 for each of the subblocks that obtained first-level correction of one error. The second-level syndrome $S_0$ will be modified by software at 29 to include the error pattern information $E_x$ corresponding to all of the corrected subblocks. When decoder 24 has received a nonzero value for $S_1$, $S_2$ or $S_3$ and is unable to correct the subblock, it indicates the presence of more than one error in the subblock by providing a subblock identifier f to the local memory 28. The unprocessed syndromes $S_1$, $S_2$ and $S_3$ for subblock f are also passed on to the local memory for later processing by the second-level decoder. Second-level decoding software 30 will combine syndrome $S_0$ with the syndromes $S_1$, $S_2$, $S_3$ from local memory 28 and convert these combined inputs by table look-up into outputs y and z indicative of the error locations and $E_y$ and $E_z$ indicative of the error patterns. These outputs y, z, $E_y$, $E_z$ will be combined with the identifier f of the subblock in error for causing the bytes in error $B_y$ and $B_z$ to be corrected. The second-level error correction software 31 fetches the subblocks from the buffer 27 and delivers corrected data by providing correction of bytes $B_y$ and $B_z$ of subblock f using the error location information y,z and error patterns $E_y$ and $E_z$.

And now the inventive concept will be explained more specifically. The basic two-level ECC scheme, as described in the aforementioned copending application has n subblocks in a block with N bytes in each subblock. The capability at the first level of decoding provides correction of up to one byte error in each of the subblocks. The capability, including the second level of decoding provides correction of up to two-byte errors in one subblock and one-byte error in all other subblocks in a block.

The basic error event is a "byte in error". A burst error may cause correlated errors in adjacent bytes; however, sufficient interleaving is assumed to effectively randomize these errors. With appropriate interleaving, all bytes are assumed equally likely to be in error as seen by the error correction code (ECC) scheme. Each byte contains a preselected number of bits m; the corresponding operations for the error correction code will be carried out in a finite field, $GF(2^m)$, of $2^m$ elements. As illustrated, m is 8 and the finite field, $GF(2^8)$, has 256 elements.

Mathematical Background—Logarithms of Field Elements

Let $G(x)$ denote a primitive polynominal of degree 8 with binary coefficients.

$$G(x) = g_0 \oplus g_1 x^2 \oplus \ldots \oplus g_7 x^7 \oplus x^8$$

The companion matrix of the polynominal G(x) is defined as the following nonsingular matrix:

$$T = \begin{bmatrix} 0 & 0 & 0 & 0 & 0 & 0 & 0 & g_0 \\ 1 & 0 & 0 & 0 & 0 & 0 & 0 & g_1 \\ 0 & 1 & 0 & 0 & 0 & 0 & 0 & g_2 \\ 0 & 0 & 1 & 0 & 0 & 0 & 0 & g_3 \\ 0 & 0 & 0 & 1 & 0 & 0 & 0 & g_4 \\ 0 & 0 & 0 & 0 & 1 & 0 & 0 & g_5 \\ 0 & 0 & 0 & 0 & 0 & 1 & 0 & g_6 \\ 0 & 0 & 0 & 0 & 0 & 0 & 1 & g_7 \end{bmatrix}$$

The matrix $T^i$ denotes T multiplied by itself i times and all numbers reduced modulo-2. The matrices $T, T^2, T^3, \ldots, T^{255}$ are all distinct, and $T^{255}$ is the identity matrix, which can also be written as $T^0$. These 255 matrices represent $(2^8-1)$ nonzero elements of $GF(2^8)$. Let $\alpha$ denote the primitive element of $GF(2^8)$. Then $T^i$ represents the nonzero element $\alpha^i$ for all i. The zero element is represented by the $8 \times 8$ all-zero matrix. The sum and product operations in $GF(2^8)$ are, then, defined by the modulo-2 matrix-sum and matrix-product operations, using these matrix representations of the field elements.

The elements of $GF(2^8)$ can also be represented by the 8-digit binary vectors. The square matrices in the above representation are very redundant. In fact, each matrix can be uniquely identified by just one of its columns (in a specific position), which can very well be used for representation of the corresponding field element without ambiguity. In particular, the first column of each $8 \times 8$ matrix in the above set is the commonly used 8-digit vector representation of the corresponding field element. This establishes a one-to-one correspondence between the set of all nonzero 8-digit vectors and the set of $T^i$ matrices representing the field elements $\alpha^i$. Thus, each nonzero 8-digit vector S corresponds to a unique integer i ($0 \leq i \leq 254$) which can be regarded as its logarithm to the base $\alpha$.

Appendix A.1 is a table of logarithms which maps all field elements into powers of $\alpha$. Appendix A.2 is a table of antilogarithms which maps integer powers of $\alpha$ into corresponding field elements. These tables were generated, using the following companion matrix T as the representation for the base element $\alpha$:

$$T = \begin{bmatrix} 0 & 0 & 0 & 0 & 0 & 0 & 0 & 1 \\ 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 1 \\ 0 & 0 & 0 & 1 & 0 & 0 & 0 & 0 \\ 0 & 0 & 0 & 0 & 1 & 0 & 0 & 1 \\ 0 & 0 & 0 & 0 & 0 & 1 & 0 & 0 \\ 0 & 0 & 0 & 0 & 0 & 0 & 1 & 1 \end{bmatrix}$$

With the help of these tables, the product $A_1 \oplus A_2$ (of the two elements represented by 8-digit vectors $A_1$ and $A_2$) can be computed as follows:

| | | |
|---|---|---|
| $A_1 = \alpha^{i_1}$ | Use log table: | $\log_\alpha A_1 = i_1$ |
| $A_2 = \alpha^{i_2}$ | Use log table: | $\log_\alpha A_2 = i_2$ |
| $A_1 \times A_2 = \alpha^{i_1+i_2}$ | Add (modulo-255): | $i = i_1 + i_2$ |
| $\alpha^i = A$ | Use antilog table: | $\log_\alpha^{-1} i = A$ |

Each table requires a memory of $8 \times 256$ bits in which the word number or memory location expressed as 8-bit vector is the input vector. The stored 8-bit vector in that memory location represents the logarithm and the antilogarithm corresponding to the input vector in the two tables, respectively. Note that A=0 (the all-zero vector) cannot be processed using the log and antilog tables. Thus, it should be treated as a special case as follows: Multiplication by zero always produces zero and division by zero should not be permitted.

First-Level Decoding Process: Single Error Correction

As illustrated herein, decoding of first level errors can be accomplished using a software method involving table look-up operations.

A nonzero value for $S_1$, $S_2$ or $S_3$ indicates the presence of error. Assume the subblock has only one byte (byte x) in error; then the read byte $B_x$ corresponds to the written byte $\hat{B}_x$ as $$\hat{B} = B_x \oplus E_x \quad (1)$$

where $E_x$ is the error pattern in the byte x

When the subblock has only one byte (byte x) in error, the syndromes are related to $E_x$ as $$S_1 = T^x E_x \quad (2)$$

$$S_2 = T^{2x} E_x \quad (3)$$

$$S_3 = T^{3x} E_x \quad (4)$$

In this method, equations (2), (3) and (4) are viewed as relations among field elements in $GF(2^8)$. In particular, the matrix multiplication of the type $T^i B$ represents the product of field elements $\alpha^i$ and $\beta$, where $\alpha^i$ is represented by the first column of matrix $T^i$, and $\beta$ is represented by the column vector B.

The product operation in $GF(2^8)$ has been discussed above, with reference to the log and antilog tables (Appendices A.1 and A.2 respectively) to the base $\alpha$, where $\alpha$ is a primitive field element. With the help of these tables, the error-position or location value x can be computed from Equations (2), (3) and (4) as follows:

$$x = (\log_\alpha S_2 - \log_\alpha S_1) \text{ modulo} - 255$$

Also $$x = (\log_\alpha S_3 - \log_\alpha S_2) \text{ modulo} - 255 \quad (5)$$

And the error pattern $E_x$ can be computed from Equations (2) and (5) as:

$$E_x = \log_\alpha^{-1} (\log_\alpha S_1 - x) \text{ modulo} - 255 \quad (6)$$

All terms in Equations (5) and (6) are 8-digit binary sequences. In modulo$-255$ computations, subtraction of an 8-digit binary number is equivalent to addition of its complement. For this, it is convenient to use an 8-digit binary adder with end-around carry, in which the 8-digit all-ones sequence (value 255) represents the number zero, and a high-order carry (value 256) is equivalent to the number one.

Each computation of x requires two references to the log table (Appendix A.1) and one modulo-255 subtract operation. Similarly, the computation of $E_x$ requires one reference to the antilog table (Appendix A.2). The byte $\hat{B}_x$ is then corrected as $\hat{B}_x + E_x$.

Note that if $S_1 = S_2 = 0$ and $S_3 \neq 0$ then the error is in check byte $C_2$. In Equation (5), x is computed two ways, the result of which must be the same; otherwise there are more than one bytes in error. Also, if $S_1 \neq S_2$ and $S_1$ or $S_2$ is zero, then there are more than one bytes in error. The subblock in that case has errors but remains uncorrected through the first level processing. Such subblock is identified by the subblock number f and the corresponding syndromes $S_1$, $S_2$, $S_3$ are stored in local memory and passed on for later second level processing.

Second-Level Decoding Process: Two-Error Correction

Assume only one subblock contains two bytes in error denoted by y and z with error patterns $E_y$ and $E_z$, respectively. The syndromes $S_0$, $S_1$, $S_2$ and $S_3$ are related to $E_y$ and $E_z$ as follows:

$$S_0 = E_y \oplus E_z \quad (7)$$

$$S_1 = T^y E_y \oplus T^z E_z \quad (8)$$

$$S_2 = T^{2y} E_y \oplus T^{2z} E_z \quad (9)$$

$$S_3 = T^{3y} E_y \oplus T^{3z} E_z \quad (10)$$

The first level processing for the corresponding subblock will have detected these errors as a multiple error. With $S_1$, $S_2$ and $S_3$ available at the subblock-level, the subblock-level processing of syndromes will not miscorrect these errors as a one-symbol error $E_x$ in position x.

To decode the combined set of subblock and block-level syndromes for two-symbol errors, see Appendix B which explains, the theory behind the decoding algorithm. First, vectors P, Q and R are obtained. As illustrated, they are 8-digit constants which are functions of the syndromes $S_0$, $S_1$, $S_2$, and $S_3$, as given by:

$$P = (S_2 \otimes S_2) \oplus (S_3 \otimes S_1) \quad (11)$$

$$Q = (S_2 \otimes S_1) \oplus (S_3 \otimes S_0) \quad (12)$$

$$R = (S_0 \otimes S_2) \oplus (S_1 \otimes S_1) \quad (13)$$

where $\otimes$ denotes the product operation of the field elements in $GF(2^8)$, and the field elements are represented by binary 8-digit vectors. The product operation can be realized using hard-wired logic or through the use of log and antilog tables in $GF(2^8)$.

Note that P, Q, and R are necessarily nonzero when there are two bytes in error and both are in data bytes of the subblocks. In contrast, when the check byte $C_1$ or $C_2$ is among the two erroneous bytes, this is indicated by $P = 0$ and $R = 0$, respectively.

Assume now that there are exactly two erroneous bytes in one of the subblocks. Then the error-location values y and z are two unique solutions of i in the equation:

$$T^{-2i} P \oplus T^{-i} Q = R \quad (14)$$

where P, Q, and R are functions of the syndromes $S_0$, $S_1$, $S_2$, and $S_3$, as given by Equations (11) to (13).

For each of the two solution values of i, the error pattern is given by:

$$E_i = R/(T^{2i} S_0 \oplus S_2) \quad (15)$$

The proof of this appears in Appendix B.

According to an important feature of the invention, decoding of the combined set of subblock and block-level syndromes for two-symbol errors can be accomplished using a software method involving table look-up operations. Vectors P, Q and R are computed from syndromes $S_0$, $S_1$, $S_2$ and $S_3$, using the log and antilog tables of Appendices A.1 and A.2, respectively. This requires, at the most, eighteen references to the tables in memory, six binary-add (modulo−255) operations, and three vector-add (modulo−2) operations.

The error-location values y and z can be obtained through a simple table look-up procedure. The table and the theory behind this procedure appear in Appendix C. In this method, the error-location values y and z are obtained through the following four-step procedure.

Step 1: Obtain two binary numbers u and v from vectors P, Q, and R, using log and antilog tables Appendices A.1 and A.2, respectively.

$$u = (\log_\alpha P - \log_\alpha Q) \text{ modulo} - 255 \quad (16)$$

$$v = (\log_\alpha R - \log_\alpha Q) \text{ modulo} - 255 \quad (17)$$

Step 2: Calculate the value d from the sum of said two binary numbers as a step toward determining the locations of the two errors, as follows:

$$d = (u + v) \text{ modulo} - 255 \quad (18)$$

Step 3: Obtain the value t, having a specific mathematical relation to value d, from the table of Appendix C.1.

Step 4: Obtain error-location values y and z by calculating the offset of said binary numbers from the value t, as follows:

$$y = (u - t) \text{ modulo} - 255 \quad (19)$$

$$z = (t - v) \text{ modulo} - 255 \quad (20)$$

All terms in Equations (16) to (20) of the above procedure are 8-digit binary sequences undergoing modulo−255 add or subtract operations. The procedure requires four table look-up operations, four modulo−255 subtact operations, and one modulo−255 add operation. In this procedure, an invalid value of d (the one with no entry in Appendix C.1) or an invalid error location value for y or z (greater than m+1) indicates an uncorrectable error involving three or more bytes in error.

The error pattern $E_y$ can be computed using the log and antilog tables (Appendices A.1 and A.2, respectively) in accordance with Equation (15), in which matrix multiplication $T^{2y} S_0$ is replaced by the corresponding field element given by the product $\alpha^{2y} \otimes S_0$ of two field elements.

The error pattern $E_z$ can be computed similarly, using Equation (15) or alternatively from Equation (9), which gives:

$$E_z = S_0 \oplus E_y \quad (21)$$

The subblock error correction is then accomplished by correcting bytes $B_y$ and $B_z$ with error patterns $E_y$ and $E_z$.

While the embodiment, as illustrated, assumed a two-level code structure in which a one-byte error in a codeword is correctable at the first level and a two-byte error in a codeword is correctable at the block level, it should be understood that the method and apparatus may be used to correct two byte errors in any single or multi-level code structure.

It should also be recognized that the disclosed method and apparatus will also operate to decode the syndromes for two-byte errors in a record of a predetermined number of bytes, in which each byte contains a preselected number of bits.

Also, while the method and apparatus, as disclosed, correct errors in encoded uncorrected data in a magnetic disk storage device, they are equally applicable to a tape or optical storage device.

Finally, it should be understood that, if preferred, in lieu of the software implementation herein described, decoding of first level (single) errors may be accomplished by hardware, such as disclosed in U.S. Pat. No. 4,525,838, issued June 25, 1985, assigned to the assignee of the present invention.

It will therefore be understood by those skilled in the art that the foregoing and other applications and/or implementations may be made to the method and apparatus herein described without departing from the spirit, scope and teaching of the invention. Accordingly, the method and apparatus herein disclosed are to be considered merely as illustrative and the invention is to be limited only as specified in the claims.

While the invention has been particularly shown and described with reference to a preferred embodiment thereof, it will be understood by those skilled in the art that various other changes in the form and details may be made therein without departing from the spirit and scope of the invention.

APPENDEX A.1

Logarithms (base $\alpha$) in GF $(2^8)$
$\log_\alpha S = i$

| S | i | S | i | S | i | S | i | S | i |
|---|---|---|---|---|---|---|---|---|---|
| 001 | 00000000 | 052 | 10111100 | 103 | 11111010 | 154 | 10100101 | 205 | 01000000 |
| 002 | 00000001 | 053 | 11111100 | 104 | 10111101 | 155 | 11110100 | 206 | 11111011 |
| 003 | 00001101 | 054 | 11001101 | 105 | 10111000 | 156 | 10101101 | 207 | 00110000 |
| 004 | 00000010 | 055 | 00110001 | 106 | 11111101 | 157 | 10100110 | 208 | 10111110 |
| 005 | 00011010 | 056 | 10110101 | 107 | 00011000 | 158 | 10000100 | 209 | 10010000 |
| 006 | 00001110 | 057 | 11010100 | 108 | 11001110 | 159 | 11110101 | 210 | 10111001 |
| 007 | 10110010 | 058 | 00011111 | 109 | 10011100 | 160 | 00011111 | 211 | 00100110 |
| 008 | 00000011 | 059 | 10010111 | 110 | 00110010 | 161 | 01001010 | 212 | 11111110 |
| 009 | 10111111 | 060 | 00101001 | 111 | 01100011 | 162 | 01110110 | 213 | 00001100 |
| 010 | 00011011 | 061 | 01111100 | 112 | 10110110 | 163 | 11100100 | 214 | 00011001 |
| 011 | 10010001 | 062 | 00111011 | 113 | 10011010 | 164 | 00010110 | 215 | 10110001 |
| 012 | 00001111 | 063 | 01110010 | 114 | 11010101 | 165 | 01100001 | 216 | 11001111 |
| 013 | 10111010 | 064 | 00000110 | 115 | 01111000 | 166 | 01010010 | 217 | 11001011 |
| 014 | 10110011 | 065 | 01111111 | 116 | 10100000 | 167 | 11111000 | 218 | 10011101 |
| 015 | 00100111 | 066 | 01001000 | 117 | 11101000 | 168 | 01101000 | 219 | 00111001 |
| 016 | 00000100 | 067 | 01011111 | 118 | 10011000 | 169 | 00001000 | 220 | 00110011 |
| 017 | 00110100 | 068 | 00110110 | 119 | 11100110 | 170 | 01001111 | 221 | 11101110 |
| 018 | 11000000 | 069 | 00100011 | 120 | 00101010 | 171 | 01011010 | 222 | 01100100 |
| 019 | 11101111 | 070 | 01101110 | 121 | 10100010 | 172 | 11011111 | 223 | 11000110 |
| 020 | 00011100 | 071 | 10001001 | 122 | 01111101 | 173 | 10000001 | 224 | 10110111 |
| 021 | 01100101 | 072 | 11000010 | 123 | 00100001 | 174 | 01011101 | 225 | 00010111 |
| 022 | 10010010 | 073 | 00101101 | 124 | 00111100 | 175 | 10000111 | 226 | 10011011 |
| 023 | 11000111 | 074 | 01010111 | 125 | 11101010 | 176 | 10010101 | 227 | 01100010 |
| 024 | 00010000 | 075 | 11100001 | 126 | 01110011 | 177 | 01110000 | 228 | 11010110 |
| 025 | 11010000 | 076 | 11110001 | 127 | 01001100 | 178 | 00111111 | 229 | 01010011 |
| 026 | 10111011 | 077 | 10100100 | 128 | 00000111 | 179 | 00101111 | 230 | 01111001 |
| 027 | 11001100 | 078 | 10101100 | 129 | 01011001 | 180 | 11011011 | 231 | 11111001 |
| 028 | 10110100 | 079 | 10000011 | 130 | 10000000 | 181 | 10001011 | 232 | 10100001 |
| 029 | 10011110 | 080 | 00011110 | 131 | 10000110 | 182 | 01101011 | 233 | 00100000 |
| 030 | 00101000 | 081 | 01110101 | 132 | 01001001 | 183 | 10101010 | 234 | 11101001 |
| 031 | 00111010 | 082 | 00010101 | 133 | 11100011 | 184 | 11001010 | 235 | 01001011 |
| 032 | 00000101 | 083 | 01010001 | 134 | 01100000 | 185 | 00111000 | 236 | 10011001 |
| 033 | 01000111 | 084 | 01100111 | 135 | 11110111 | 186 | 11101101 | 237 | 01110111 |
| 034 | 00110101 | 085 | 01001110 | 136 | 00110111 | 187 | 11000101 | 238 | 11100111 |
| 035 | 01101101 | 086 | 11011110 | 137 | 11000100 | 188 | 10001111 | 239 | 11100101 |
| 036 | 11000001 | 087 | 01011100 | 138 | 00100100 | 189 | 00100101 | 240 | 00101011 |
| 037 | 01010110 | 088 | 10010100 | 139 | 10101111 | 190 | 00001011 | 241 | 11100000 |
| 038 | 11110000 | 089 | 00111110 | 140 | 01101111 | 191 | 10110000 | 242 | 10100011 |
| 039 | 10101011 | 090 | 11011010 | 141 | 00101110 | 192 | 00010011 | 243 | 10000010 |
| 040 | 00011101 | 091 | 01101010 | 142 | 10001010 | 193 | 11011100 | 244 | 01111110 |
| 041 | 00010100 | 092 | 11001001 | 143 | 10101000 | 194 | 11011000 | 245 | 01011110 |
| 042 | 01100110 | 093 | 11101100 | 144 | 11000011 | 195 | 10001100 | 246 | 00100010 |
| 043 | 11011101 | 094 | 10001110 | 145 | 10101110 | 196 | 01000110 | 247 | 10001000 |
| 044 | 10010011 | 095 | 00001010 | 146 | 00110101 | 197 | 01101100 | 248 | 00111101 |
| 045 | 11011001 | 096 | 00010010 | 147 | 10100111 | 198 | 01010101 | 249 | 01101001 |
| 046 | 11001000 | 097 | 11010111 | 148 | 01011000 | 199 | 10101010 | 250 | 11101011 |
| 047 | 10001101 | 098 | 01000101 | 149 | 10000101 | 200 | 11010011 | 251 | 00001001 |
| 048 | 00010001 | 099 | 01010100 | 150 | 11100010 | 201 | 10010110 | 252 | 01110100 |
| 049 | 01000100 | 100 | 11010010 | 151 | 11110110 | 202 | 01111011 | 253 | 01010000 |
| 050 | 11010001 | 101 | 01111010 | 152 | 11110010 | 203 | 01110001 | 254 | 01001101 |

APPENDIX A.1-continued

Logarithms (base $\alpha$) in GF ($2^8$)
$\log_\alpha S = i$

| S | i | S | i | S | i | S | i | S | i |
|---|---|---|---|---|---|---|---|---|---|
| 051 | 01000001 | 102 | 01000010 | 153 | 11110011 | 204 | 01000011 | 255 | 01011011 |

Note: S in polynomial notation has high order term on the left.

APPENDIX A.2

Antilogarithms (base $\alpha$) in GF ($2^8$)
$\alpha^i = S$

| i | S | i | S | i | S | i | S | i | S |
|---|---|---|---|---|---|---|---|---|---|
| 000 | 00000001 | 051 | 11011100 | 102 | 00101010 | 153 | 11101100 | 204 | 00011011 |
| 001 | 00000010 | 052 | 00010001 | 103 | 01010100 | 154 | 01110001 | 205 | 00110110 |
| 002 | 00000100 | 053 | 00100010 | 104 | 10101000 | 155 | 11100010 | 206 | 01101100 |
| 003 | 00001000 | 054 | 01000100 | 105 | 11111001 | 156 | 01101101 | 207 | 11011000 |
| 004 | 00010000 | 055 | 10001000 | 106 | 01011011 | 157 | 11011010 | 208 | 00011001 |
| 005 | 00100000 | 056 | 10111001 | 107 | 10110110 | 158 | 00011101 | 209 | 00110010 |
| 006 | 01000000 | 057 | 11011011 | 108 | 11000101 | 159 | 00111010 | 210 | 01100100 |
| 007 | 10000000 | 058 | 00011111 | 109 | 00100011 | 160 | 01110100 | 211 | 11001000 |
| 008 | 10101001 | 059 | 00111110 | 110 | 01000110 | 161 | 11101000 | 212 | 00111001 |
| 009 | 11111011 | 060 | 01111100 | 111 | 10001100 | 162 | 01111001 | 213 | 01110010 |
| 010 | 01011111 | 061 | 11111000 | 112 | 10110001 | 163 | 11110010 | 214 | 11100100 |
| 011 | 10111110 | 062 | 01011001 | 113 | 11001011 | 164 | 01001011 | 215 | 01100001 |
| 012 | 11010101 | 063 | 10110010 | 114 | 00111111 | 165 | 10011010 | 216 | 11000010 |
| 013 | 00000011 | 064 | 11001101 | 115 | 01111110 | 166 | 10011101 | 217 | 00101101 |
| 014 | 00000110 | 065 | 00110011 | 116 | 11111100 | 167 | 10010011 | 218 | 01011010 |
| 015 | 00001100 | 066 | 01100110 | 117 | 01010001 | 168 | 10001111 | 219 | 10110100 |
| 016 | 00011000 | 067 | 11001100 | 118 | 10100010 | 169 | 10110111 | 220 | 11000001 |
| 017 | 00110000 | 068 | 00110001 | 119 | 11101101 | 170 | 11000111 | 221 | 00101011 |
| 018 | 01100000 | 069 | 01100010 | 120 | 01110011 | 171 | 00100111 | 222 | 01010110 |
| 019 | 11000000 | 070 | 11000100 | 121 | 11100110 | 172 | 01001110 | 223 | 10101100 |
| 020 | 00101001 | 071 | 00100001 | 122 | 01100101 | 173 | 10011100 | 224 | 11110001 |
| 021 | 01010010 | 072 | 01000010 | 123 | 11001010 | 174 | 10010001 | 225 | 01001011 |
| 022 | 10100100 | 073 | 10000100 | 124 | 00111101 | 175 | 10001011 | 226 | 10010110 |
| 023 | 11100001 | 074 | 10100001 | 125 | 01111010 | 176 | 10111111 | 227 | 10000101 |
| 024 | 01101011 | 075 | 11101011 | 126 | 11110100 | 177 | 11101111 | 228 | 10100011 |
| 025 | 11010110 | 076 | 01111111 | 127 | 01000001 | 178 | 00000111 | 229 | 11101111 |
| 026 | 00000101 | 077 | 11111110 | 128 | 10000010 | 179 | 00001110 | 230 | 01110111 |
| 027 | 00001010 | 078 | 01010101 | 129 | 10101101 | 180 | 00011100 | 231 | 11101110 |
| 028 | 00010100 | 079 | 10101010 | 130 | 11110011 | 181 | 00111000 | 232 | 01110101 |
| 029 | 00101001 | 080 | 11111101 | 131 | 01001111 | 182 | 01110000 | 233 | 11101010 |
| 030 | 01010000 | 081 | 01010011 | 132 | 10011110 | 183 | 11100000 | 234 | 01111101 |
| 031 | 10100000 | 082 | 10100110 | 133 | 10010101 | 184 | 01101001 | 235 | 11111010 |
| 032 | 11101001 | 083 | 11100101 | 134 | 10000011 | 185 | 11010010 | 236 | 01011101 |
| 033 | 01111011 | 084 | 01100011 | 135 | 10101111 | 186 | 00001101 | 237 | 10111010 |
| 034 | 11110110 | 085 | 11000110 | 136 | 11110111 | 187 | 00011010 | 238 | 11011101 |
| 035 | 01000101 | 086 | 00100101 | 137 | 01000111 | 188 | 00110100 | 239 | 00010011 |
| 036 | 10001010 | 087 | 01001010 | 138 | 10001110 | 189 | 01101000 | 240 | 00100110 |
| 037 | 10111101 | 088 | 10010100 | 139 | 10110101 | 190 | 11010000 | 241 | 01001100 |
| 038 | 11010011 | 089 | 10000001 | 140 | 11000011 | 191 | 00001001 | 242 | 10011000 |
| 039 | 00001111 | 090 | 10101011 | 141 | 00101111 | 192 | 00010010 | 243 | 10011001 |
| 040 | 00011110 | 091 | 11111111 | 142 | 01011110 | 193 | 00100100 | 244 | 10011011 |
| 041 | 00111100 | 092 | 01010111 | 143 | 10111100 | 194 | 01001000 | 245 | 10011111 |
| 042 | 01111000 | 093 | 10101110 | 144 | 11010001 | 195 | 10010000 | 246 | 10010111 |
| 043 | 11110000 | 094 | 11110101 | 145 | 00001011 | 196 | 10001001 | 247 | 10000111 |
| 044 | 01001001 | 095 | 01000011 | 146 | 00010110 | 197 | 10111011 | 248 | 10100111 |
| 045 | 10010010 | 096 | 10000110 | 147 | 00101100 | 198 | 11011111 | 249 | 11100111 |
| 046 | 10001101 | 097 | 10100101 | 148 | 01011000 | 199 | 00001111 | 250 | 01101111 |
| 047 | 10110011 | 098 | 11100011 | 149 | 10110000 | 200 | 00101110 | 251 | 11001110 |
| 048 | 11001111 | 099 | 01101111 | 150 | 11001001 | 201 | 01011100 | 252 | 00110101 |
| 049 | 00110111 | 100 | 11011110 | 151 | 00111011 | 202 | 10111000 | 253 | 01101010 |
| 050 | 01101110 | 101 | 00010101 | 152 | 01110110 | 203 | 11011001 | 254 | 11010100 |

Note: S in polynomial notation has high order term on the left.

APPENDIX B

Theory for Decoding Two-Symbol Errors

This Appendix B provides the background for the decoding algorithm for two-symbol errors. This is derived from the well-known prior art method called Chien Search in decoding the generalized BCH code, which is described in the Chien paper cited above in the "Background Art" section.

Assume that there are exactly two erroneous bytes in one of the subblocks. The following proof will establish that error-location values y and z are two unique solutions of i in the equation:

$$T^{-2i}P \oplus T^{-i}Q = R \qquad (B\text{-}1)$$

where P, Q and R are functions of syndromes $S_0$, $S_1$, $S_2$ and $S_3$, as given by Equations (11)-(13). The error patterns $E_i$ for $i=y$ or $i=z$ each satisfies the following equation:

$$R = (T^{2i}S_0 \oplus S_2) \otimes E_i \qquad (B\text{-}2)$$

Proof: The syndromes are expressed as functions of the two errors in Equations (7)–(10). These equations are rewritten here as:

$$S_0 = E_y \oplus E_z \tag{B-3}$$

$$S_1 = T^y E_y \oplus T^z E_z \tag{B-4}$$

$$S_2 = T^{2y} E_y \oplus T^{2z} E_z \tag{B-5}$$

$$S_3 = T^{3y} E_y \oplus T^{3z} E_z \tag{B-6}$$

Combining appropriate equations from (B-3) through (B-6), we have:

$$T_y S_0 \oplus S_1 = (T^y \oplus T^z) E_z \tag{B-7}$$

$$T^y S_1 \oplus S_2 = T^z(T^y \oplus T^z) E_z \tag{B-8}$$

$$T^y S_2 \oplus S_3 = T^{2z}(T^y \oplus T^z) E_z \tag{B-9}$$

Matrix Equations (B-7), (B-8), and (B-9) are relations among field elements in $GF(2^8)$ represented by matrices. In particular, the matrix multiplication of the type $T^i B$ represents the product of field element $\alpha^i$ and $\beta$, where $\alpha^i$ is represented by the first column of matrix $T^i$, and $\beta$ is represented by the column vector B. In view of this interpretation, Equations (B-7), (B-8), and (B-9) yield the following relationship:

$$(T^y S_0 \oplus S_1) \otimes (T^y S_2 \oplus S_3) = (T^y S_1 \oplus S_2)^2 \tag{B-10}$$

where $\otimes$ denotes the product of corresponding elements in $GF(2^8)$. The Equation (B-10) can be rearranged into the following matrix equation:

$$T^{2y} R \oplus T^y Q \oplus P = 0 \tag{B-11}$$

In these equations, P, Q and R are column vectors given by:

$$P = (S_2 \otimes S_2) \oplus (S_3 \otimes S_1) \tag{B-12}$$

$$Q = (S_2 \otimes S_1) \oplus (S_3 \otimes S_0) \tag{B-13}$$

$$R = (S_0 \otimes S_2) \oplus (S_1 \otimes S_1) \tag{B-14}$$

Thus y is one of the solutions for i in the equation $$T^{-2i} P \oplus T^{-i} Q = R \tag{B-15}$$

By exchanging the variables y and z in the above process, it can be shown that z is the second solution for i in Equation (B-15).

Equation (B-2) for each error pattern can be verified by direct substitution of values for R, $S_0$, $S_1$ and $S_2$. Both sides of
Equation (B-2) reduce to the expression:

$$(T^{2y} \oplus T^{2z})(E_y \otimes E_z) \tag{B-16}$$

thereby completing the proof.

APPENDIX C

Table Look-up Solution for Two Error Locations

In Appendix B, it was shown that the error locations y and z for two errors in a subblock can be determined by solving for i in Equation (B-1). That equation is rewritten here as:

$$T^{-2i} P \oplus T^{-i} Q = R \tag{C-1}$$

The constants P, Q and R are functions of syndromes $S_0$, $S_1$, $S_2$ and $S_3$, given by Equations (B-12)–(B-14), respectively. We can obtain logarithms of P, Q and R from the log-antilog tables of Appendices A.1 and A.2.

$$p = \log_\alpha P \tag{C-2}$$

$$q = \log_\alpha Q \tag{C-3}$$

$$r = \log_\alpha R \tag{C-4}$$

Then the matrix Equation (C-1) can be rewritten as a relation among field elements in $GF(2^8)$ as follows:

$$\alpha^{-2i} \cdot \alpha^p \oplus \alpha^{-i} \cdot \alpha^q = \alpha^r \tag{C-5}$$

Multiplying both sides of Equation (C-5) by $\alpha^{p-2q}$, we obtain:

$$\alpha^{-2i+2p-2q} \oplus \alpha^{(-i+p-q)} = \alpha^{(r+p-2q)} \tag{C-6}$$

Substituting t for $(-i+p-q)$ in Equation (C-6), gives $$\alpha^{2t} \oplus \alpha^t = \alpha^{(r+p-2q)} \tag{C-7}$$

and $$i = (u) - t, \tag{C-8}$$

where $u = p - q$

The right-hand side of Equation (C-7) is a known field element $\alpha^d$, in which the exponent d is:

$$d = u + v, \tag{C-9}$$

where $u = p - q$, and $v = r - q$

A table look-up solution is then provided for Equation (C-7) which can be rewritten as:

$$\alpha^t(\alpha^t \oplus \alpha^0) = \alpha^d \tag{C-10}$$

Using this expression, each value of t (from 0 to 254) can be related to a value of d. Note that some values of d are absent in this relationship, and that each valid value of d corresponds to two values of t. For a given value of d, if $t = t_1$ is one of the solutions of Equation (C-10), then it is apparent that $t = t_2$ is also a solution where:

$$\alpha^{t_2} = \alpha^{t_1} \oplus \alpha^0 \tag{C-11}$$

Substituting $t = t_1$ in Equation (C-10) and then using (C-11), $$\alpha^{t_1} \cdot \alpha^{t_2} = \alpha^d \tag{C-12}$$

Thus, $$d = t_1 + t_2 \tag{C-13}$$

From equations (C-8), (C-9) and (C-13), the following two error location values $i_1$ and $i_2$ are obtained:

$$i_1 = u - t_1 \tag{C-14}$$

$$i_2 = u - t_2 = t_1 - v \tag{C-15}$$

Appendix C.1 relates each valid value of d to one of the two values of t. Values of d are listed in ascending order for easy reference as addresses of an 8×256-bit memory. The corresponding value of t is stored in memory as an 8-bit binary number. The all-zeros vector (invalid value shown by dashes in the table) is stored at addresses corresponding to the invalid values of d, and is so interpreted.

In case of two errors, the computed value of d fetches one of the two values for t from Appendix C.1. With this one value of t, Equations (C-14) and (C-15) provide the two values of i as the error locations y and z. An invalid value of d fetches t=0 from Appendix C.1, which is interpreted as an uncorrectable error involving three or more bytes of the codeword.

APPENDIX C.1

Table of t vs d in: $a^d = a^i(a^t + a^0)$

| d | t | d | t | d | t | d | t | d | t |
|---|---|---|---|---|---|---|---|---|---|
| 000 | 01010101 | 051 | 10001010 | 102 | 00010101 | 153 | 01000101 | 204 | 00101010 |
| 001 | -------- | 052 | -------- | 103 | 10001011 | 154 | 10100101 | 205 | 11100101 |
| 002 | -------- | 053 | 01001011 | 104 | -------- | 155 | 11001011 | 206 | 00010111 |
| 003 | 00111000 | 054 | -------- | 105 | 00011111 | 156 | 10101011 | 207 | -------- |
| 004 | -------- | 055 | 10010111 | 106 | 10010110 | 157 | 00101110 | 208 | -------- |
| 005 | -------- | 056 | 00000100 | 107 | 10011100 | 158 | 00100001 | 209 | -------- |
| 006 | 01110000 | 057 | 01010111 | 108 | -------- | 159 | -------- | 210 | 00111110 |
| 007 | 10000000 | 058 | -------- | 109 | 10010011 | 160 | -------- | 211 | 00100100 |
| 008 | -------- | 059 | 01011100 | 110 | 00101111 | 161 | -------- | 212 | 00101101 |
| 009 | -------- | 060 | -------- | 111 | -------- | 162 | 00110101 | 213 | -------- |
| 010 | -------- | 061 | 01000010 | 112 | 00001000 | 163 | -------- | 214 | 00111001 |
| 011 | 00001100 | 062 | -------- | 113 | -------- | 164 | -------- | 215 | -------- |
| 012 | 00101011 | 063 | -------- | 114 | 10101110 | 165 | 00101001 | 216 | -------- |
| 013 | -------- | 064 | -------- | 115 | 01111001 | 166 | 00111101 | 217 | 11100010 |
| 014 | 00000001 | 065 | -------- | 116 | -------- | 167 | 01001000 | 218 | 00100111 |
| 015 | -------- | 066 | -------- | 117 | -------- | 168 | 01001101 | 219 | -------- |
| 016 | -------- | 067 | -------- | 118 | 10111000 | 169 | 01001111 | 220 | 01011110 |
| 017 | 01110111 | 068 | 01100110 | 119 | 00010110 | 170 | 00100010 | 221 | 01011000 |
| 018 | -------- | 069 | 01101010 | 120 | -------- | 171 | -------- | 222 | -------- |
| 019 | 01000001 | 070 | -------- | 121 | -------- | 172 | 00011011 | 223 | 00100110 |
| 020 | -------- | 071 | -------- | 122 | 10000100 | 173 | 00111011 | 224 | 00010000 |
| 021 | 01101011 | 072 | -------- | 123 | -------- | 174 | -------- | 225 | -------- |
| 022 | 00011000 | 073 | -------- | 124 | -------- | 175 | -------- | 226 | -------- |
| 023 | -------- | 074 | -------- | 125 | -------- | 176 | 11000000 | 227 | -------- |
| 024 | 01010110 | 075 | 01010010 | 126 | -------- | 177 | -------- | 228 | 01011101 |
| 025 | -------- | 076 | 00000101 | 127 | 10011000 | 178 | 01000110 | 229 | -------- |
| 026 | -------- | 077 | 01111010 | 128 | -------- | 179 | 11000101 | 230 | 11110010 |
| 027 | -------- | 078 | 01111000 | 129 | 00011100 | 180 | 00100101 | 231 | -------- |
| 028 | 00000010 | 079 | 10010000 | 130 | -------- | 181 | 01001110 | 232 | -------- |
| 029 | -------- | 080 | -------- | 131 | 01000000 | 182 | 11001001 | 233 | 00010010 |
| 030 | -------- | 081 | 10011010 | 132 | -------- | 183 | -------- | 234 | -------- |
| 031 | -------- | 082 | -------- | 133 | 00000110 | 184 | -------- | 235 | -------- |
| 032 | -------- | 083 | 10011110 | 134 | -------- | 185 | 10111100 | 236 | 01110001 |
| 033 | -------- | 084 | 10100110 | 135 | -------- | 186 | -------- | 237 | -------- |
| 034 | 00110011 | 085 | 00010001 | 136 | 10111011 | 187 | 00001011 | 238 | 00101100 |
| 035 | -------- | 086 | 10001101 | 137 | 10100000 | 188 | -------- | 239 | 00010011 |
| 036 | -------- | 087 | -------- | 138 | 10110101 | 189 | -------- | 240 | -------- |
| 037 | -------- | 088 | 01100000 | 139 | -------- | 190 | -------- | 241 | -------- |
| 038 | 10000010 | 089 | 00100011 | 140 | -------- | 191 | 01001100 | 242 | -------- |
| 039 | 00111100 | 090 | 10010010 | 141 | -------- | 192 | 00001110 | 243 | -------- |
| 040 | -------- | 091 | 01110110 | 142 | -------- | 193 | 00100000 | 244 | 00001001 |
| 041 | -------- | 092 | -------- | 143 | -------- | 194 | 00000011 | 245 | -------- |
| 042 | 01010011 | 093 | -------- | 144 | -------- | 195 | -------- | 246 | -------- |
| 043 | 01100100 | 094 | -------- | 145 | -------- | 196 | 01010000 | 247 | 01101110 |
| 044 | 00110000 | 095 | -------- | 146 | -------- | 197 | -------- | 248 | -------- |
| 045 | 01001001 | 096 | 00000111 | 147 | 00011110 | 198 | -------- | 249 | -------- |
| 046 | -------- | 097 | 10000001 | 148 | -------- | 199 | -------- | 250 | -------- |
| 047 | -------- | 098 | 00101000 | 149 | 00110010 | 200 | -------- | 251 | 00110111 |
| 048 | 10000011 | 099 | -------- | 150 | 10100100 | 201 | 00001111 | 252 | -------- |
| 049 | 00010100 | 100 | -------- | 151 | -------- | 202 | 00011001 | 253 | 01100010 |
| 050 | -------- | 101 | 10001100 | 152 | 00001010 | 203 | -------- | 254 | 00110001 |

Note: Absence of a value for t implies an invalid value of d.

Having thus described our invention, what I claim as new, and desire to secure by Letters Patent is:

1. A method of correcting two errors in encoded uncorrected data in records of a predetermined length read from a storage device by decoding and processing four syndromes of error, said method comprising:

providing an indication of the presence of two errors in any one record;

responsive to said indication, decoding said syndromes by computing vectors which are functions of said four syndromes;

calculating two binary numbers from said vectors by table look-up;

calculating one value from the sum of said binary numbers for the purpose of determining the locations of said two errors;

determining another value, having a specific mathematical relation to said one value, by table look-up;

calculating values identifying the locations of said errors by calculating the offset of said binary numbers from said other value;

computing the error patterns of said errors by table look-up; and correcting said errors at said locations using said error patterns.

2. The method of claim 1, including using log and antilog tables for computing said vectors from said four syndromes and computing said error patterns.

3. In a method of correcting two errors in encoded uncorrected data in records of a predetermined length read from a storage device by decoding and processing four syndromes of error ($S_1$, $S_2$, $S_3$, $S_0$), where a byte and each syndrome consists of b binary bits, the steps of:

providing an indication of the presence of two errors in any one record;

responsive to said indication, decoding said syndromes by computing vectors P, Q and R which are functions of said four syndromes;

calculating binary numbers u and v from said vectors by table look-up, where $$u = (\log_\alpha P - \log_\alpha Q) \text{ modulo} - (2^b - 1)$$

$$v = (\log_\alpha R - \log_\alpha Q) \text{ modulo} - (2^b - 1);$$

and calculating the value of d toward determining the locations of the errors, where $$d = (u + v) \text{ modulo} - (2^b - 1).$$

4. In the method of claim 3, the further steps of:

determining a value t, having a specific mathematical relation to value d, from a look-up table wherein the value of d for each of $(2^b - 1)$ values of t is predetermined by computing the value of d using an expression which will provide for each valid value of d two values of t; and in the case of two errors, fetching from the computed value of d one of the two values of t for the purpose of determining the locations of the errors.

5. In the method of claim 3, the further steps of:

determining a value t, corresponding to value d, from a look-up table of t vs. d in $\alpha^d = \alpha^t(\alpha^t \oplus \alpha^o)$; and calculating error location values y and z, where $$y = (u - t) \text{ modulo} - (2^b - 1);$$

and $$z = (t - v) \text{ modulo} - (2^b - 1).$$

6. In the method of claim 5, the further step of: computing error patterns $E_y$ and $E_z$ using said log and antilog tables, where $$E_y = R/(T^{2y}S_0 \oplus S_2);$$

and $$E_z = S_0 \oplus E_y.$$

7. The method of claim 3, wherein the vectors P, Q and R are computed from said four syndromes using a $\log_\alpha S = i$ log table and an antilog table $\alpha^i = S$ in $GF(2^b)$, where $GF(2^b)$ represents a finite field of $2^b$ elements.

8. The method of claim 3, wherein b is 8 and modulo $-(2^b - 1)$ is therefore modulo $-255$.

9. Apparatus for correcting two errors in encoded uncorrected data in records of a predetermined length read from a storage device by decoding and processing four syndromes of error, said apparatus comprising:

means providing an indication of the presence of two errors in any one record;

means responsive to said indication for decoding said syndromes by computing vectors which are functions of said four syndromes;

means, including log and antilog look-up tables, for calculating two binary numbers u and v from said vectors; and means, including said binary numbers for calculating one of the two values of an interim variable t from the sum d of said binary numbers for the purpose of determining the locations of said errors;

means for calculating values y and z identifying the locations of said errors by calculating the offset of said binary numbers u and v from said one value of the interim variable t;

means, including said log and antilog tables, for computing error patterns of said two errors; and means for correcting said errors at said locations using said error patterns.

10. The apparatus of claim 9, including means, including said log and antilog tables, for computing said vectors from said four syndromes.

* * * * *